United States Patent [19]
Yamaguchi et al.

[11] Patent Number: 5,124,236
[45] Date of Patent: Jun. 23, 1992

[54] PHOTOPOLYMERIZABLE COMPOSITION

[75] Inventors: Jun Yamaguchi; Shintaro Washizu; Fumiaki Shinozaki, all of Shizuoka, Japan

[73] Assignee: Fuji Photo Film Co., Ltd., Kanagawa, Japan

[21] Appl. No.: 215,707

[22] Filed: Jul. 6, 1988

[30] Foreign Application Priority Data

Jul. 6, 1987 [JP] Japan ................... 62-168196

[51] Int. Cl.$^5$ .............................................. G03C 1/73
[52] U.S. Cl. .................................... 430/281; 430/914; 430/920; 430/921; 522/26; 522/27; 522/28
[58] Field of Search ............... 430/920, 921, 914, 281; 522/26, 27, 28

[56] References Cited

U.S. PATENT DOCUMENTS

| | | | |
|---|---|---|---|
| 3,955,620 | 4/1976 | Chantross et al. | 430/921 |
| 4,346,162 | 9/1982 | Abele | 430/920 |
| 4,594,310 | 6/1986 | Nagasaka | 430/920 |
| 4,657,942 | 4/1987 | Iwasaki et al. | 430/920 |
| 4,772,530 | 9/1988 | Gottschalk et al. | 430/914 |
| 4,772,541 | 9/1988 | Gottschalk et al. | 430/281 |
| 4,800,149 | 1/1989 | Gottschalk et al. | 430/914 |
| 4,859,572 | 8/1989 | Farid et al. | |

*Primary Examiner*—Jack P. Brammer
*Attorney, Agent, or Firm*—Sughrue, Mion, Zinn, Macpeak and Seas

[57] ABSTRACT

A photopolymerizable composition is disclosed, which comprises a photopolymerizable compound and a photopolymerization initiator comprising a cationic dye, an organic boron compound and a compound having an —SH group in the molecule thereof, and which can be used for making printing plates, as resist materials for making printed circuit boards, as color proof materials, etc.

The photopolymerizable composition can be applied for an image-forming process utilizing microcapsules, which comprises the steps of encapsulating the photopolymerizable composition with a color image-forming material in the core of microcapsules, coating the microcapsules on a support to form a photosensitive sheet, imagewise exposing the photosensitive sheet, superposing the photosensitive sheet on an image-receiving sheet, pressing the whole surface of the assembly to rupture the microcapsules at the unexposed portions, and transferring the color image-forming material into the image-receiving sheet.

The color image obtained by using the photopolymerizable composition exhibits high sensitivity.

11 Claims, No Drawings

PHOTOPOLYMERIZABLE COMPOSITION

FIELD OF THE INVENTION

This invention relates to a novel photopolymerizable composition. More specifically, the invention relates to a high-sensitive and spectrally sensitized photopolymerizable composition which can be used for making lithographic printing plates and resin relief plates, as resists or photomasks for making printed boards, and making black and white or color transfer sheets or coloring sheets.

BACKGROUND OF THE INVENTION

A photopolymerizable composition fundamentally contains a photopolymerization initiator and an addition polymerizable compound having at least two ethylenically unsaturated bonds in the molecule (hereinafter, the polymerizable compound is referred to as "polyfunctional monomer"). When the composition is irradiated by light, the composition is hardened to change the tackiness thereof, and becomes insoluble in the solvent. By utilizing these properties, these photopolymerizable compositions have been widely used for photography, printing, surface processing of metals, inks, etc. The utilization methods and application examples of such a composition are described, for example, in J. Kosar, *Light Sensitive Systems*, pages 158-193, published by J. Wiley & Sons, New York (1965) and K.I. Jacobson and R.E. Jacobson, *Imaging Systems*, pages 181-222, published by J. Wiley & Sons, New York (1976).

Also, recently, as an image forming method utilizing a photopolymerizable composition, an image forming system utilizing light-sensitive microcapsules containing a photopolymerizable composition in the microcapsules has been proposed. For example, JP-A-57-124343, JP-A-57-179836 and JP-A-57-197538 (the term "JP-A" as used herein indicates an "unexamined published Japanese patent application" disclose a method of forming dye images by imagewise exposing the coloring sheet having a coated layer of microcapsules containing a dye and a photopolymerizable composition composed of a vinyl compound and a photopolymerization initiator, superposing the coloring sheet onto an image-receiving sheet, and applying pressure to the whole assembly.

Also, an attempt of spectrally sensitizing the photopolymerizable composition up to the visible light wavelength region and forming digital images using a laser as a light source and an application of such a photopolymerizable composition to full color photographic light-sensitive materials has been investigated.

For example, in *Nihon Shasin Gakkai-shi (Journal of The Society of Photographic Science and Technology of Japan)*, Vol. 49, No. 3, page 230(1986) and *Kino Zairyo (Functional Materials)*, pages 48–60, (September, 1983), describe a spectral sensitization method of photopolymerizable compositions for laser recording. Also, JP-A-59-189340 describes a method of spectrally sensitizing an organic peroxide initiator with an organic dye. Furthermore, EP-A 223587 discloses organic boron anion salts of organic cationic dyes.

In particular, a method of using the organic boron compound anionic salt of the organic cationic dye as a photosensitive initiator, has a wide selection range for cationic dye compounds and is useful in designing a photopolymerization initiator composition sensitive to optional wavelengths.

However, by such a method, the photopolymerization initiator composition obtained, having sensitivity to visible light through the light sensitivity thereof, is still unsatisfactory. Thus, in EP-A-223587, the sensitivity is increased by combining the aforesaid composition with an N,N-dialkylaniline derivative, in particular 2,6-diisopropyl-N,N-dimethylaniline. However, the light sensitivity obtained by using the aforesaid combination is yet insufficient.

For photopolymerizabion initiators having light sensitivity to mainly ultraviolet light, various methods for improving the sensitivity have hitherto been known.

For example, a method is known of combining an aminophenyl ketone and an active methyl compound or an amino compound (as described in U.S. Pat. No. 3,661,588), a combination of Michler's ketone and benzophenone (as described in U.S. Pat. No. 3,682,641), a combination of a 2,4,5-triphenylimidazolyl dimer and an organic mercapto compound (as described in U.S. Pat. No. 3,479,185), a combination of an aromatic ketone or a polynuclear quinone and a mercaptoimidazoline or a mercaptobenzoxazole (as described in JP-A-53-702), and a combination of a p-dialkylaminostilbene derivative, a hexaarylbiimidazole, and a mercaptobenzoxazole or a mercaptobenzimidazole (as described in JP A-59-56403).

However, a high sensitivity imparting technique for a novel combination of an organic cationic dye and an organic boron compound anionic salt photopolymerization initiator having light sensitivity to light of longer wavelength than visible light has not yet been known.

SUMMARY OF THE INVENTION

An object of this invention is to provide a novel photopolymerizable composition having high sensitivity and having light sensitivity to a light source of visible light or longer wavelength region. More particularly, the object of this invention is to provide a photopolymerizable composition having high sensitivity and having a light sensitivity of a visible light or longer wavelength region (for example, to a laser light source), and which is advantageously utilized for making lithographic printing plates and resin relief plates, and as a resist or a photomask for making printed boards.

Another object of this invention is to provide microcapsules having light sensitivity to a light source of a visible light or longer wavelength region and capable of being advantageously used for the formation of black and white or color images.

As a result of various investigations, the inventors have discovered that the aforesaid objects can be attained by a photopolymerizable composition comprising:

(a) a polymerizable compound having at least one ethylenically unsaturated bond in the molecule, (b) an organic boron compound anionic salt of an organic cationic dye represented by formula (I) shown below, and (c) a compound having an -SH group in the molecule thereof, as represented by formula (II) shown below;

wherein D+ represents a cationic dye, and $R^1$, $R^2$, $R^3$, and $R^4$, which may be the same or different, each represents an alkyl, aryl, aralkyl, alkaryl, alkenyl, alkinyl, alicyclic, heterocyclic, or allyl group having carbon atoms less than 18 or a group selected from the derivatives of these groups; with the proviso that at least two of $R^1$, $R^2$, $R^3$, and $R^4$ may combine to form a ring structure; and

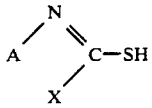 (II)

wherein X represents NR' (wherein R' represents a hydrogen atom, an alkyl group having from 1 to 12 carbon atoms, a phenyl group or a phenyl group substituted with a halogen atom or an alkyl group having from 1 to 4 carbon atoms), an oxygen atom, a sulfur atom, a methylene group or a methine group; and A represents a residual group to form a 5- or 6-membered heterocyclic ring together with the moiety —N=CX—X— or a residual group being composed of 2 or 3 carbon atoms, which forms a part of an aromatic ring.

DETAILED DESCRIPTION OF THE INVENTION

In formula (II), A preferably represents $-Y^1-Y^2-Y^3-$, $-Y^{1'}=Y^{2'}-Y^1-$, $-Y^1-Y^{1'}=Y^{2'}-$, $-Y^1-Y^2-Y^1-Y^2-$, $Y^{1'}=Y^{2'}-$, $-Y^1-Y^{1'}=$, or

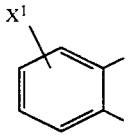

wherein $Y^1$, $Y^2$ and $Y^3$, which may be the same or different, each represents $>CX^2-X^3$ or $>N-X^4$ (wherein $X^2$, $X^3$, and $X^4$, which may be the same or different, each represents a hydrogen atom or an alkyl group having from 1 to 12 carbon atoms), $Y^{1'}$, $Y^{2'}$ and $Y^{3'}$, which may be the same or different, each represents

or a nitrogen atom (wherein $X^5$ represents a hydrogen atom, an alkyl group having from 1 to 12 carbon atoms, or —SR" wherein R" represents a hydrogen atom or an alkalkyl group having from 1 to 8 carbon atoms), and $X^1$ represents a hydrogen atom, an alkyl group having from 1 to 12 carbon atoms, a halogen atom, an alkoxy group having from 1 to 12 carbon atoms, a phenyl group, or a phenyl group substituted with a halogen atom or an alkyl group having from 1 to 4 carbon atoms.

Typical examples of the groups represented by A are —CH$_2$CH$_2$—, —CH=CH—, —N=N—, —N=C(SR'')—(wherein R'' is defined as above), —CH$_2$—CH$_2$—CH$_2$—, phenylene and naphthalene. As described above, A may form a part of an aromatic ring together with the moiety —N=C—X—.

The organic boron compound anionic salt of an organic cationic dye shown by formula (I) described above, can be prepared by the method described in EP-A1-223587 using an organic cationic dye and an organic boron compound anion.

The organic cationic dyes for use in this invention include, for example, cationic methine dyes (preferably polymethine dyes, cyanine dyes, and azomethine dyes, and more preferably cyanine dyes, carbocyanine dyes, and hemicyanine dyes); carbonium dyes (preferably triarylmethane dyes, xanthene dyes, acridine dyes, and more preferably rhodamine); quinonimine dyes (preferably azine dyes, oxazine dyes, and thiazine dyes); quinoline dyes; and thiazole dyes. These dyes may be used singly or as a combination thereof.

As the organic cationic dyes for use in this invention, commercially available dyes and the aforesaid known organic cationic dyes can be used. Specific examples of these dyes are described in the paragraph "Enkisei Senryo (Basic Dyes)", *Senryo Binran (Dye Handbook)* edited by Yuki Kagaku Kyokai; T.H. James, *The Theory of the Photographic Process*, pages 194–290, published by Macmillan Publishing Co., Inc. (1977) Kinosei Shikiso no Kaqaku (Chemistry or Functional Dyes), pages 1–32, 189206, and 401–413, published by CMC Shuppan Sha; JP-A-59-189340, and EP-A1-223587.

Of the aforesaid dyes, cyanine dyes and xanthene dyes are particularly useful in this invention.

Practical examples of the cyanine dyes useful in this invention are dyes represented by formula (III);

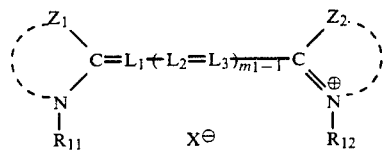 (III)

wherein $Z_1$ and $Z_2$ each represents an atomic group necessary for completing a heterocyclic nucleus ordinarily used for cyanine dyes, such as, a thiazole nucleus, a thiazoline nucleus, a benzothiazole nucleus, a naphthothiazole nucleus, an oxazole nucleus, an oxazoline nucleus, a benzoxazole nucleus, a naphthoxazole nucleus, a tetrazole nucleus, a pyridine nucleus, a quinoline nucleus, an imidazoline nucleus, an imidazole nucleus, a benzimidazole nucleus, a naphthoimidazole nucleus, a selenazoline nucleus, a selenazole nucleus, a benzoselenazole nucleus, a naphthoselenazole nucleus, and an indolenine nucleus.

These nuclei may be substituted by a lower alkyl group (such as a methyl group, etc.), a halogen atom, a phenyl group, a hydroxy group, an alkoxy group having from 1 to 4 carbon atoms, a carboxy group, an alkoxycarbonyl group having from 1 to 8 carbon atoms, an alkylsulfamoyl group having from 1 to 8 carbon atoms, an alkylcarbamoyl group having from 1 to 8 carbon atoms, an acetyl group, an acetoxy group, a cyano group, a trichloromethyl group, a trifluoromethyl group, a nitro group, etc.

In formula (III) described above, $L_1$, $L_2$, and $L_3$ each represents a methine group or a substituted methine group. Examples of the substituent for the substituted methine group are a lower alkyl group having from 1 to 18 carbon atoms (such as a methyl group, an ethyl group, etc.), a phenyl group, a substituted phenyl group, a methoxy group, an ethoxy group, and an aralkyl group having from 1 to 18 carbon atoms in the alkyl moiety (such as a phenethyl group).

$L_1$ and $R_{11}$, $L_3$ and $R_{12}$, or, when $m_1$ is 3, $L_2$ and $L_2$, may be alkylene-crosslinked to form a 5- or 6-membered ring.

In formula (III), $R_{11}$ and $R_{12}$ each represents a lower alkyl group (having, preferably from 1 to 18 carbon atoms), a substituted alkyl group (preferably, the alkylene moiety has from 1 to 18 carbon atoms) having a substituent such as a carboxy group, a sulfo group, a hydroxy group, a halogen atom, an alkoxy group having from 1 to 4 carbon atoms, a phenyl group, and a substituted phenyl group (examples of the substituted alkyl group being ⊖-sulfoethyl, γ-sulfopropyl, γ-sulfobutyl, δ-sulfobutyl, 2-[2-(3-sulfopropoxy)ethoxy]ethyl, 2-hydroxysulfopropyl, 2-chlorosulfopropyl, 2-methoxyethyl, 2-hydroxyethyl, carboxymethyl, 2-carboxyethyl, 2,2,3,3'-tetra-fluoropropyl, and 3,3,3-trifluoroethyl), an allyl group, or other substituted alkyl group which is usually used as an N-substituent of a cyanine dye.

In formula (III), $m_1$ represents 1, 2, or 3, and $X\ominus$ represents a boron compound anion of formula (I) described above.

Practical examples of the xanthene dyes useful in this invention are those shown by formula (IV):

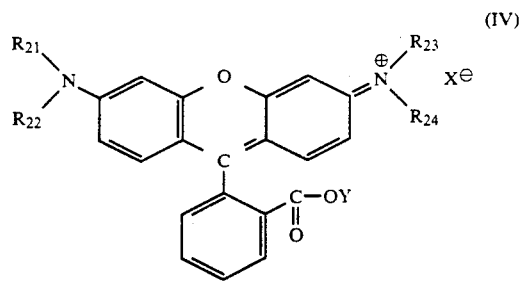

wherein $R_{21}$, $R_{22}$, $R_{23}$, and $R_{24}$ each independently represents a hydrogen atom, an alkyl group having from 1 to 6 carbon atoms or an aryl group having from 6 to 24 carbon atoms, which may be substituted with an alkyl group having from 1 to 18 carbon atoms; $X^-$ represents a boron compound anion of formula (I) described above; and Y represents a hydrogen atom, an alkyl group having from 1 to 18 carbon atoms, an aryl group having 6 to 24 carbon atoms, which may be substituted with an alkyl group having from 1 to 18 carbon atoms, or an alkali metal.

Specific examples of the preferred organic boron compound anion salts of the organic cationic dye compound for use in this invention are illustrated below. However, the invention is understood not to be limited to these compounds.

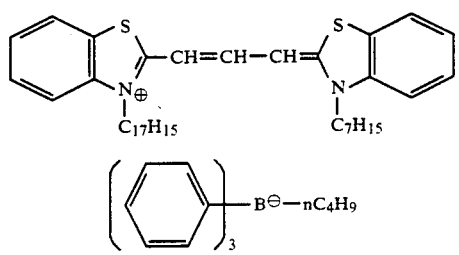

1

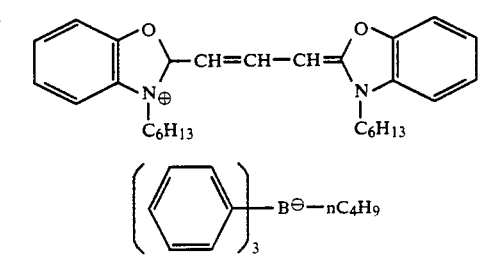

2

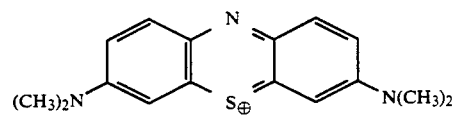

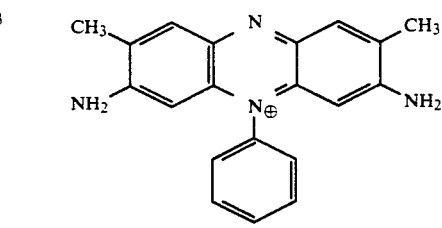

3

4

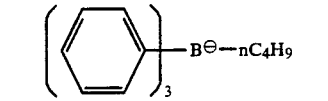

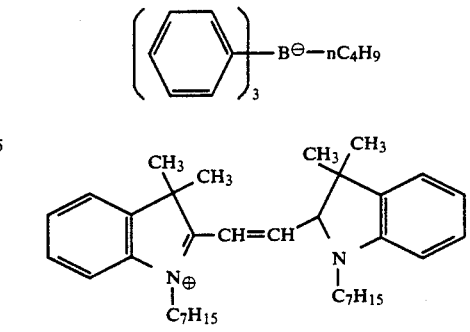

5

6

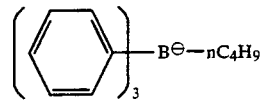

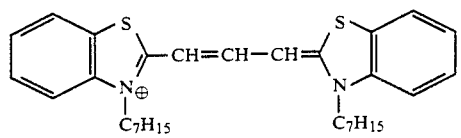

7

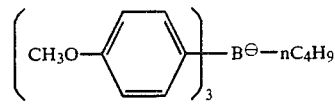

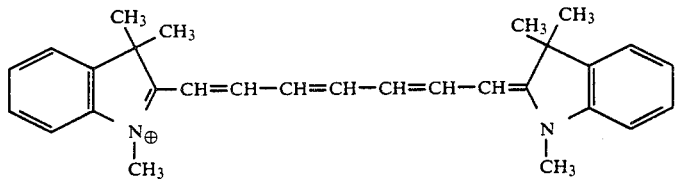

8

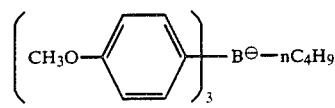

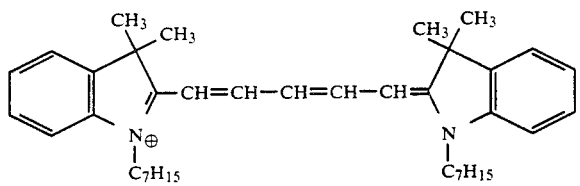

9

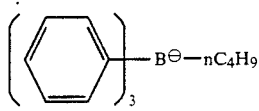

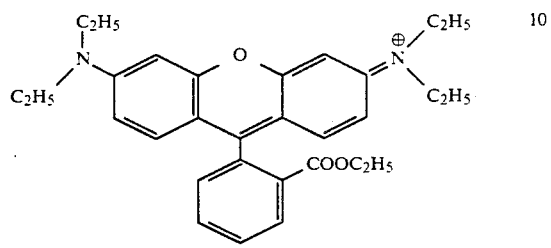

10

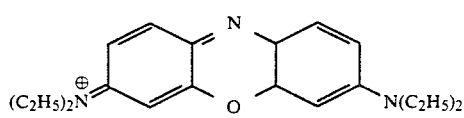

11

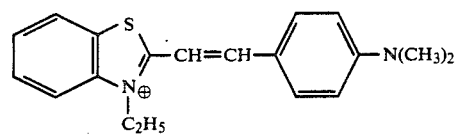

12

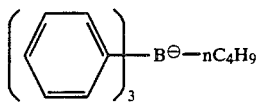

Specific examples of the compound having an —SH group in the molecule as shown by formula (II) described above, are 2-mercapto-imidazoline, 2-mercapto-thiazoline, 2 mercapto-1-methyl-imidazole, 5-amino-1,3,4-thiodiazole-2-thiol, 2-mercapto-benzoxazole, 2-mercapto-benzimidazole, 2-mercapto-benzothiazole, 1H-1,2,4-triazole-3-thiol, 2-mercapto-pyridine, 2-mercapto-quinoline, 1,2-naphthyl(2-mercapto)oxazole, 6-ethoxy-2-mercaptobenzothiazole, phenylmercaptotetrazole, and the compounds shown by the following formulae (V) or (VI);

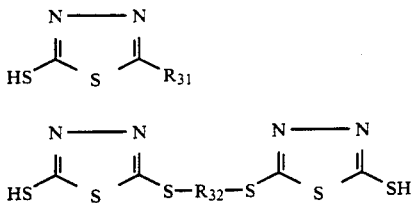

wherein $R_{31}$ represents a substituted or unsubstituted alkyl group having from 1 to 8 carbon atoms, a substituted or unsubstituted aralkyl group having from 6 to 14 carbon atoms, a substituted or unsubstituted alkylthio group having from 1 to 8 carbon atoms, or a substituted or unsubstituted aralkylthio group having from 6 to 14 carbon atoms and $R_{32}$ represents a substituted or unsubstituted alkylene group having from 2 to 12 carbon atoms.

Specific examples of the compounds shown by formulae (V) and (VI) described above are illustrated below, however it is to be understood that the present invention is not limited thereto.

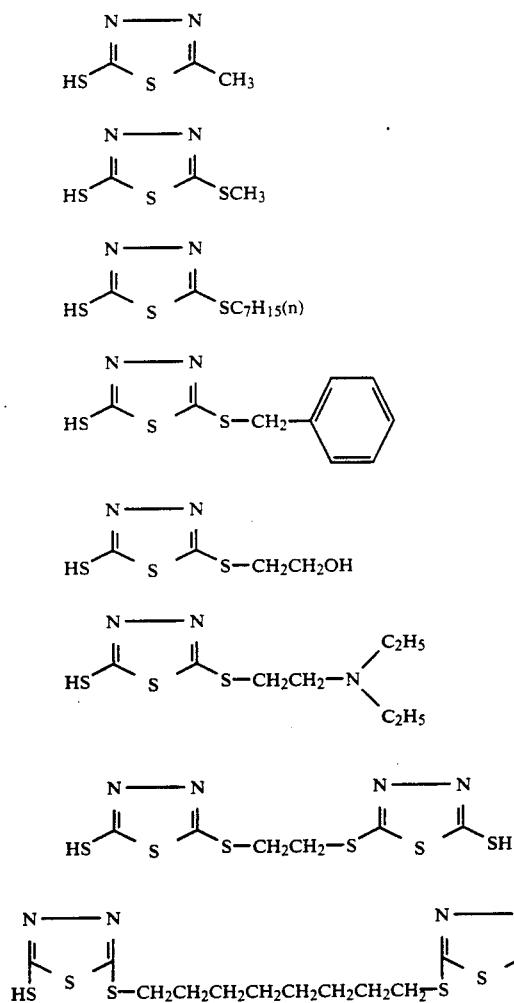

The addition amounts of the compounds shown by formulae (I) and (II) described above, are preferably from 0.01 to 50% by weight, and more preferably from 1 to 20% by weight, based on the amount of the polymerizable compound described hereinbelow.

The polymerizable compounds having an ethylenically unsaturated bond in the photopolymerizable composition of this invention is a compound having at least one ethylenically unsaturated bond in the chemical structure thereof and has a chemical form such as a monomer and a prepolymer, e.g., a dimer, a trimer or other oligomer, or a mixture thereof.

Examples of the polymerizable compounds are esters of unsaturated carboxylic acids or the salts thereof and aliphatic polyhydric alcohol compounds, and amides of unsaturated carboxylic acids or the salts thereof and aliphatic polyhydric amine compounds.

Specific examples of the unsaturated carboxylic acid are acrylic acid, methacrylic acid, itaconic acid, crotonic acid, isocrotonic acid, and maleic acid.

As the salt of the unsaturated carboxylic acid, there are sodium salts and potassium salts of the aforesaid carboxylic acids.

Specific examples of the ester of the aliphatic polyhydric alcohol compound and the unsaturated carboxylic acid are acrylic acid esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, sorbitol triacrylate, sorbitol tetraacrylate, sorbitol pentaacrylate, sorbitol hexaacrylate, and polyester acrylate oligomer; methacrylic acid esters, such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2-hydroxypro-poxy)phenyl]dimethylmethane, and bis-[p-(methacryloxy-ethoxy)phenyl]dimethylmethane; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate; crotonic acid esters, such as ethylene glycol dicrotonate, tetramethylene glycol dicrotonate, pentaerythritol dicrotonate, and sorbitol tetracrotonate; isocrotonic acid esters, such as ethylene glycol diisocrotonate, pentaerythritol diisocrotonate, and sorbitol tetraisocrotonate; and maleic acid esters, such as ethylene glycol dimaleate, triethylene glycol dimaleate, pentaerythritol dimaleate, and sorbitol tetramaleate. A mixture of these esters may be also used.

Also, specific examples of the amide of the aliphatic polyhydric amine compound and the unsaturated carboxylic acid are methylene-bis-acrylamide, methylene-bis-methacrylamide, 1,6-hexamethylene-bis-acrylamide, 1,6-hexamethylene-bis-methacrylamide, diethylenetriaminetrisacrylamide, xylylene-bis-acrylamide, and xylylene-bis-methacrylamide.

Other examples of the aforesaid polymerizable compound which can be used in this invention are vinyl-urethane compounds having two or more polymerizable vinyl groups in one molecule thereof, obtained by adding a vinyl monomer having a hydroxy group shown by formula (VII) below, to a polyisocyanate compound having two or more kinds of isocyanate groups in one molecule as described in JP-B-48-41708 (the term "JP-B" as used herein means an "examined Japanese patent application");

$$CH_2=C(R_{41})COOCH_2CH(R_{42})OH \qquad (VII)$$

wherein $R_{41}$ and $R_{42}$ each represents a hydrogen atom or a methyl group.

Also, high molecular weight compounds having a vinyl group or a vinylidene group, such as the condensates of a high molecular weight compound having a hydroxy group, an amino group, an epoxy group, a halogen atom or a sulfonyloxy group and acrylic acid, methacrylic acid or a derivative thereof, can be also used as the aforesaid polymerizable compound in this invention.

Furthermore, color image-forming materials such as dyes or leuco dyes having a vinyl group in the molecule thereof can be also utilized as the polymerizable compound in this invention.

The novel photopolymerizable composition of this invention comprising the polymerizable compound having an ethylenically unsaturated bond, the organic boron compound anion salt of the organic cationic dye compound, and the compound having —SH in the molecule thereof described above, can be used for various purposes.

For example, a photosensitive material obtained by forming a layer of the photopolymerizable composition and a binder on a support can be applied to various fields, e.g., for making printing plates and as resist materials for making printed circuit boards, as described in U.S. Pat. Nos. 4,604,342, 4,587,199, 4,629,680, 4,431,723, and 4,550,073, JP-A-61-285444 and JP-A-61-213213, and as color proof materials, as described in JP-A-62-67529.

Also, the photopolymerizable composition of this invention is highly-sensitive and has a light sensitivity to visible light and hence, can be particularly advantageously used for image-forming systems utilizing microcapsules.

For utilizing the photopolymerizable composition of this invention for an image-forming system utilizing microcapsules, reference can be made to the descriptions of JP-A-57-197538, JP-A-58-88739, JP-A-61-130945 and JP-A-58-88740, and EP-A-223587.

In an example of such an image-forming process, microcapsules containing a photopolymerization initiator composition composed of an ethylenic vinyl compound and a photopolymerizing initiator and a dye precursor are coated on a support to form a photosensitive sheet. The photosensitive sheet is imagewise exposed to harden the microcapsules at the exposed portions. The sheet is then superposed on a developer sheet followed by pressing the whole surface of the assembly to rupture the microcapsules at the unexposed portions, whereby the color image-forming material (e.g., the dye precursor) is transferred into the image-receiving element (e.g., the color developer sheet) and colored.

The case of applying this invention to an imageforming system utilizing microcapsules as described above, is further explained below.

The photopolymerizable composition according to the present invention can further contain numerous additives as needed for various purposes. For example, the composition can contain a heat polymerization inhibitor, a polymerization accelerator, a color image-forming material (a dye, a dye precursor, or a pigment), etc.

The heat polymerization inhibitor is added for inhibiting the polymerization of the photopolymerizable composition during storage. Specific examples of the heat polymerization inhibitor are p-methoxyphenol, hydroquinone, alkyl- or aryl-substituted hydroquinone, t-butylcatechol, pyrogallol, cuprous chloride, chloranil, naphthylamine, β-naphthol, 2,6-di-t-butyl-p-cresol, pyridine, nitrobenzene, dinitrobenzene, p-toluidine, methylene blue-organic copper, and methyl salicylate.

The heat polymerization inhibitor is preferably added in an amount of from 0.001 to 5 parts by weight, more preferably from 0.002 to 0.1 part by weight, per 100 parts by weight of the ethylenically unsaturated compound.

As the polymerization accelerator, a compound acting together with the aforesaid compound having an —SH group in the molecule as a reducing agent (such as an oxygen scavenger or as a chain transfer agent of an active hydrogen donor) can be used.

As an oxygen scavenger which can be advantageously used in this invention, there are phosphine, phosphonates, phosphites, stannous salts, and other compounds which can be easily oxidized by oxygen.

As a chain transfer agent which can be advantageously used in this invention, there are N-phenylglycine, trimethylbarbituric acid, N,N-dimethyl-2,6-diisopropylaniline, N,N-2,4,6-pentamethylaniline and other compounds containing hydrogen, which can be easily extracted with a radical.

Color images can be formed by incorporating a color image-forming material in the photopolymerizable composition of this invention and coloring the polymerized portions after removing the unpolymerized portions or transferring the unpolymerized portions onto an image-receiving element.

Various materials can be used as the color image-forming materials for use in this invention.

For example, dyes or pigments having color by itself can be used as such a color image-forming material. In the case of using such dyes or pigments, color images can be formed by rupturing the portions (microcapsules) in which a high molecular weight polymer is not formed and transferring the composition in the capsules thus ruptured onto an image-receiving element in a proper manner. As the appropriate dyes or pigments, known commercially available ones or those described in, for example, *Senryo Binran (Dye Handbook)*, edited by Yuki Gosei Kagaku Kyokai (1970) and *Saishin Ganryo Binran (Newest Pigment Handbook)*, edited by Nippon Ganryo Gijutsu Kyokai (1977), can be used.

These dyes or pigments are used as solutions or dispersions.

On the other hand, as color image-forming materials which are not colored there may either be materials which are colorless or have a light color, but which become colored by applying thereto a certain energy such as heating, pressure, light irradiation, etc.; or which are not colored themselves, even by applying energy thereto, but become colored when brought into contact with another component.

As examples of the former material, there are known thermochromic compounds, piezochromic compounds, photochromic compounds, and leuco compounds (such as triarylmethane dyes, quinone series dyes, indigoid dyes, and azine dyes). These materials are colored by heating, pressing, light irradiation or air oxidation.

An examples of the latter material, there are various systems which are colored by an acid-base reaction, an oxidation-reduction reaction, a coupling reaction, a chelate forming reaction, etc., between at least two components. For example, there are coloring systems composed of a coloring agent having a partial structure (such as lactone, lactam, spiropyran, etc.), and an acid material (color developer)(such as acid clay, a phenol, etc.), which are utilized for pressure-sensitive recording papers, etc.; a system of utilizing an azo coupling reaction of an aromatic diazonium salt, a diazotate, a diazosulfonate, etc., and a naphthol, an aniline, an active methylene, etc.; a system of utilizing a chelate-forming reaction such as a reaction of hexamethylenetetramine, ferric ion, and gallic acid and a reaction of phenolphthalein-complexon and an alkaline earth metal ion; and a system of utilizing an oxidation-reduction reaction such as a reaction of ferric stearate and pyrogallol and a reaction of behenic acid silver and 4-methoxy-1-naphthol.

Also, as other systems of coloring by the reaction of two components, a reaction which proceeds by heating is known. In this case, heating is required simultaneously with mixing the two components by the rupture of microcapsules by pressing or directly after pressing.

As the color former for the color former/color developer system, there are (1) triarylmethane series compounds, (2) diphenylmethane series compounds, (3) xanthene series compounds, (4) thiazine series compounds, and (5) spiropyran series compounds. Specific examples of these color formers are described in U.S. Pat. No. 4,283,458.

Of these color formers, (1) triarylmethane series compounds and (3) xanthene series compounds are preferred, since they give less fog and give high color density.

Practical examples of these color formers are crystal violet lactone, 3-diethylamino-6-chloro-7-($\beta$-ethoxyethylamino)fluoran, 3-diethylamino-6-methyl-7-anilinofluoran, 3-triethylamino-6-methyl-7-anilinofluoran, 3-cyclohexylmethylamino-6-methyl-7-anilinofluoran, 3-diethylamino-7-o-chloroanilinofluoran, etc. They may be used singly or as a mixture thereof.

As the color developer, phenolic compounds, organic acids or the metal salts thereof, oxybenzoic acid esters, and acid clay are used.

Examples of the phenolic compound are 4,4'-isopropylidene-diphenol (bisphenol A), p-tert-butylphenol, 2,4-dinitrophenol, 3,4-dichlorophenol, 4,4'-methylene-bis (2,6-di-tert-butylphenol), p-phenylphenol, 1,1-bis(4-hydroxyphenyl)-cyclohexane, 1,1-bis(4-hydroxyphenyl)-2-ethylhexane, 2,2-bis(4-hydroxyphenyl)-butane, 2,2'- methylene-bis(4-tert-buthyl-phenol), 2,2'-methylene-bis($\alpha$-phenyl-p-cresol)thiodiphenol, 4,4'-thio-bis(6-tert-butyl-m-cresol), and sulfonyldiphenol, as well as p-tert-butylphenol-formalin condensate, p-phenylphenol-formalin condensate, etc.

Examples of the organic acids and the metal salts are phthalic acid, phthalic anhydride, maleic acid, benzoic acid, gallic acid, o-toluic acid, p-toluic acid, salicylic acid, 3-tert-butylsalicyclic acid, 3,5-di-tertbutylsalicylic acid, 5-$\alpha$-methylbenzylsalicylic acid, 3,5-($\alpha$-methylbenzyl) salicylic acid, 3-tert-octylsalicylic acid, and the zinc salts, lead salts, aluminum salts, magnesium salts, and nickel salts of the aforesaid acids. In particular, salicylic acid derivatives and the zinc salts or aluminum salts thereof, are excellent with regard to the developing, the fastness of the colored images, and the storage stability of the recorded sheets.

Examples of the oxybenzoic acid ester are ethyl p-oxybenzoate, butyl p-oxybenzoate, heptyl p-oxybenzoate, and benzyl p-oxybenzoate.

Also, the photopolymerizable composition of this invention may be used with an oil absorptive white pigment for improving the diffusion and fixing of the content in the microcapsules.

For melting the color developer at a desired temperature for causing coloring reactions, it is preferred that the color developer is added as eutectic mixture of a low-melting point heat-fusible material, or in such a state so that the low-melting point compound is fused onto the surfaces of the color developer particles.

Practical examples of these low-melting point compounds are waxes, such as higher fatty acid amides (e.g., stearic acid amide, erucic acid amide, palmitic acid amide, and ethylenebisstearoamide) or higher fatty acid esters; phenyl benzoate derivatives; aromatic ether derivatives; and urea derivatives, although the low-melting point compounds which are used for this purpose in this invention are not limited to these compounds.

Other examples of the color former for the color former/color developer system are phenolphthalein, fluoresceine, 2',4',5',7'-tetrabromo-3,4,5,6-tetrachlorofluoresceine, tetrabromophenol blue, 4,5,6,7-tetrabromophenolphthalein, eosine, aurin cresol red, and 2-naphtholphenolphthalein.

As the color developer which is preferably used with phenolphthalein, etc., there are nitrogen-containing compounds such as inorganic and organic ammonium salts, organic amines, amides, urea and thiourea, the derivatives of urea or thiourea, thiazoles, pyrroles, pyrimidines, piperazines, guanidines, indoles, imidazoles, imidazolines, triazoles, morpholines, piperidines, amidines, formazines, and pyridines.

Specific examples of these developers are ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenyl-imidazole, 2-phenyl-4-methylimidazole, 2-undecyl-imidazoline, 2,4,5-trifuryl-2-imidazoline, 1,2-diphenyl-4,4-dimethyl-2-imidazoline, 2-phenyl-2-imidazoline 1,2,3-triphenylguanidine, 1,2-ditolylguanidine, 1,2-dicyclohexylguanidine, 1,2-dicyclohexyl-3-phenyl-guanidine 1,2,3-tricyclohexylguanidine, guanidine trichloroacetate, N,N'-dibenzylpiperazine, 4,4'-dithiomorpholine, morpholium trichloroacetate, 2-amino-benzothiazole, and 2-benzoylhydrazinobenzothiazole.

In this invention, the color image-forming material is used in an amount of from 0.5 to 50 parts by weight, and preferably from 2 to 20 parts by weight, to 100 parts by weight of the polymerizable compound. Also, the color developer is used in the range of from about 0.3 to 80 parts by weight, and preferably from 1 to 50 parts by weight, per 1 part by weight of the color former.

The microcapsules containing the photopolymerizable composition of this invention together with other necessary component(s) can be prepared by methods well known in the art.

For example, there are methods of utilizing the coacervation of a hydrophilic wall-forming material, as described in U.S. Pat. Nos. 2,800,457 and 2,800,458; an interfacial polymerization method, as described in U.S. Pat. No. 3,287,154, British Patent 990,443, JP-B-38-19574, JP-B-42-446 and JP-B-42-771; a method by the deposition of a polymer, as described in U.S. Pat. No. 3,418,250 and 3,660,304; a method of using an isocyanate-polyol wall-forming material, as described in U.S. Pat. No. 3,796,669; a method of using an isocyanate wall-forming material, as described in U.S. Pat. No. 3,914,511; a method of using a urea-formaldehyde series or urea-formaldehyde-resorcinol series wall-forming materials, as described in U.S. Pat. Nos. 4,001,140, 4,087,376, and 4,089,802; a method of using a wall-forming material such as a melamine-formaldehyde resin or hydroxypropyl cellulose, as described in U.S. Pat. No. 4,025,455; an in situ method by a polymerization of a monomer, as described in JP-B-36-9163 and JP-A-51-9079; an electrolytic dispersion and cooling method, as described in British Patents 952,807 and 965,074; and a spray drying method as described in U.S. Pat. No. 3,111,407 and British Patent 930,422.

In this case, it is preferred to form a polymer film as the microcapsule walls after emulsifying the core material(s), although the microcapsulation in this invention is not limited to this method.

For forming the microcapsule walls in this invention, the method of using a microcapsulation by the polymerization of the reactant from the inside of the oil droplets provides good results. That is, the microcapsules having uniform particle size and excellent shelf life of the recording material having the microcapsule layer can be obtained in a short period of time.

For example, in the case of using polyurethane as the wall-forming material of the microcapsules, a polyvalent isocyanate and a 2nd material for forming microcapsule walls by the reaction with the isocyanate (e.g., polyol, polyamine, etc.) are mixed with an oily liquid comprising mainly of the components essential for the present invention to be microencapsulated, the mixture is emulsified in water and then the temperature of the system is increased, whereby a polymer-forming reaction occurs at the interfaces of the oil droplets to form microcapsule walls. In this case, an auxiliary solvent having low boiling point and a strong dissolving power can be used in the oily liquid.

The polyvalent isocyanate and the polyol or polyamine being reacted with the isocyanate are described in U.S. Pat. Nos. 3,281,383, 3,773,695, 3,793,268, and 3,838,108, JP-B-48-40347, and JP-B-49-24159 and JP-A 48-84086, and they can be used in this invention.

Examples of the polyvalent isocyanate are diisocyanates, such as m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-dimethoxy-4,4'-biphenyl-diisocyanate, 3,3'-dimethyldiphenylmethane-4,4'-diisocyanate, xylylene-1,4-diisocyanate, 4,4'-diphenylpropane diisocyanate, trimethylene diisocyanate, hexamethylene diisocyanate, propylene-1,2-diisocyanate, butyrene-1,2-diisocyanate, cyclohexylene-1,2-diisocyanate, cyclohexylene-1,4-diisocyanate, etc.; triisocyanates, such as 4,4',4''-triphenylmethane triisocyanate, toluene-2,4,6-triisocyanate, etc.; tetraisocyanates, such as 4,4'-dimethyldiphenylmethane-2,2',5,5'-tetraisocyanate, etc.; and isocyanate prepolymers, such as the addition product of hexamethylene diisocyanate and trimethylolpropane, the addition product of 2,4-tolylene diisocyanate and trimethylolpropane, the addition product of xylylene diisocyanate and trimethylolpropane, and the addition product of tolylene diisocyanate and hexanetriol.

As the polyol which is used for causing the reaction with the aforesaid isocyanate, there are aliphatic and aromatic polyhydric alcohols, hydroxypolyesters, hydroxypolyalkylene ethers, etc.

Polyols described in U.S. Pat. No. 4,650,740 can be also used in this invention, including ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxy-cyclohexane, diethylene glycol, 1,2,6-trihydroxyhexane, 2-phenyl-propylene glycol, 1,1,1-trimethylolpropane, hexanetriol, pentaerythritol, a condensation product of an aromatic polyhydric alcohol and an alkylene oxide (such as an addition product of pentaerythritol and ethylene oxide, an addition product of glycerol and ethylene oxide, glycerol 1,4-di(2-hydroxyethoxy)benzene, resorcinol dihydroxyethyl ether, etc.), p-xylylene glycol, m-xylylene glycol, α,α'-diphenylmethane, 2-(p,p'-dihydroxy-diphenyl-methyl] benzyl alcohol, an addition product of bisphenol A and ethylene oxide, and an addition product of bisphenol A and propylene oxide.

It is preferred that the polyol is used in the range of from 0.02 to 2 moles, and particularly from 0.02 to 1 mole, as the hydroxy group to one mole of an isocyanate group.

As the polyamine which is used for reacting with the aforesaid polyhydric isocyanate there may be used ethylene diamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetetramine, diethylaminopropylamine, tetraethylenepentamine, and an amine addition product of an epoxy compound.

The aforesaid polyvalent isocyanate may react with water to form a high molecular weight material.

In the case of forming microcapsules, a water-soluble high molecular weight material can be used. In this case, a water-soluble anionic high molecular weight material, a water-soluble nonionic high molecular weight material, or a water-soluble amphoteric high molecular weight material may be used.

As the water-soluble anionic high molecular weight material, natural materials or synthetic materials can be used. For example, an anionic high molecular weight material having a group of —COO—, —$SO_3^-$, etc., can be used.

Specific examples of an anionic natural high molecular weight material are gum arabic, alginic acid, and pectin. Specific examples of an anionic semisynthetic high molecular weight material are carboxymethyl cellulose, phthalated gelatin, sulfated starch, sulfated cellulose, and ligninsulfonic acid. Also, specific examples of an anionic synthetic high molecular weight material are a maleic anhydride series (including hydrolyzed ones) copolymer, an acrylic acid series (including methacrylic acid series) polymer and copolymer, a vinylbenzenesulfonic acid series polymer and copolymer, and carboxy-denatured polyvinyl alcohol.

Specific examples of a nonionic high molecular weight material are polyvinyl alcohol, hydroxyethyl cellulose, and methyl cellulose.

Also, as an amphoteric high molecular weight material, there may be used gelatin, etc.

The aforesaid water-soluble high molecular weight material is used as an aqueous solution of from 0.01 to 10% by weight, preferably 1 to 7% by weight, thereof.

The particle sizes of the microcapsules for use in this invention are not more than 80 μm, and preferably not more than 20 μm, from the point of view of preservative stability and handleability. Also, if the sizes of microcapsules are too small, there is a possibility that the microcapsules vanish in the pores of the base material or the fibers thereof. This depends upon the nature of the base material or support, but the lower limit of the particle size is preferably about 0.1 μm.

It is preferred that the microcapsules in this invention are not substantially changed by a pressure of not higher than about 10 kg/cm$^2$, but are ruptured when a pressure higher than the aforesaid value is applied thereto. The pressure of causing the rupture of the microcapsules can be changed according to the specific use, and is not limited to a specific value, but it is preferred that the pressure is not higher than about 500 kg/cm$^2$. The pressure characteristics can be controlled by the particle sizes of the microcapsules, the thickness of the capsule walls, and the nature of the material constituting the capsule walls.

For encapsulating the photopolymerizable composition of this invention and a color image-forming material, a solvent can be used. Also, in the case of introducing a reducing agent, a color developer, etc., into microcapsules, a solvent can be used. By using a solvent in the microcapsules, the extent of the rupture of the microcapsules at pressing and the transfer amount of the color image-forming material in the microcapsules onto the image-receiving element can be controlled.

The amount of the solvent for use in the microcapsules is preferably from 0.01 to 500 parts by weight, more preferably from 1 to 30 parts by weight, per 100 parts by weight of the polymerizable compound.

As the solvent for use in this invention, a natural oil and a synthetic oil can be used singly or as a mixture thereof. Specific examples of the solvent are cotton seed oil, kerosene, aliphatic ketones, aliphatic esters, paraffin, naphthene oil, alkylated biphenyl, alkylated terphenyl, chlorinated paraffin, alkylated naphthalene, and a diarylethane (such as 1-phenyl-1-xylylethane, 1-phenyl-1-p-ethylphenylethane, 1,1'-ditolylethane, etc.).

As other examples of the solvent, there are phthalic acid alkyl esters (e.g., dibutyl phthalate and dioctyl phthalate), phosphoric acid esters (e.g., diphenyl phosphate, triphenyl phosphate, tricresyl phosphate, and dioctyl butylphosphate), citric acid esters (e.g., tributyl acetylcitrate), benzoic acid esters (e.g., octyl benzoate), alkylamides (e.g., diethyllaurylamide), fatty acid esters (e.g., dibutoxyethyl succinate and dioctyl azerate), trimesic acid esters (e.g., tributyl trimesate), lower alkyl acetates (e.g., ethyl acetate and butyl acetate), ethyl propionate, secondary butyl alcohol, methyl isobutyl ketone, β-ethoxyethyl acetate, methylcellosolve acetate, and cyclohexanone.

The image-receiving element which is used with the photosensitive element using the photopolymerizable composition of this invention, is an element for coloring or fixing the color image-forming material released from the photosensitive microcapsules.

The photosensitive microcapsules and the image-receiving element may exist in the same layer on the same support or as separate layers on the same support.

Further, a combination of the photosensitive sheet having a layer containing the photosensitive microcapsules on one support and an image-receiving sheet having a layer containing the image-receiving element on another support may be employed in this invention.

Furthermore, the image-receiving element for use in this invention may, if desired, contain a mordant such as an anionic polymer or a cationic polymer or both.

Binders which are used for the photosensitive material and the image-receiving material in this invention can be used singly or as a combination thereof.

The binders are hydrophilic binders such as, transparent or translucent hydrophilic binders. Specific examples thereof, are proteins such as gelatin, gelatin derivatives, cellulose derivatives, etc.; natural materials such as starch, gum arabic and other polysaccharides; synthetic polymers such as polyvinylpyrrolidone, an acrylamide polymer and other water-soluble polyvinyl compounds. As other synthetic polymers, there is a dispersed vinyl compound in the form of latex. Also, an organic solvent-soluble vinyl addition polymer can be used as the binder.

As described above, the present invention can be applied for an image-forming system utilizing microcapsules, although the application of the present invention is not to be construed as being limited to the system.

The supports which can be used for the photosensitive material and the image-receiving material in this invention must endure the processing pressure and processing temperature. As a general support, there may be used glass plates, paper, wood-free papers, coated papers, art papers, synthetic papers, metal sheets, and the like, as well as acetyl cellulose films, cellulose ester films, polyvinyl acetal films, polystyrene films, polycarbonate films, polyethylene terephthalate films, and other plastic films. Furthermore, a paper support laminated with a polymer such as polyethylene, etc., can be also used as the support. In particular, the polyester films described in U.S. Pat. Nos. 3,634,089 and 3,725,070, are preferably used.

The photosensitive material of this invention may further contain a protective layer, an antistatic layer, a curling preventing layer, a releasable layer, and a matting layer. In particular, the protective layer preferably contains an organic or inorganic matting agent for sticking prevention.

Also, the photosensitive material and the image-receiving material of this invention may further contain, if necessary, an antifoggant, an optical whitening agent, a browning preventing agent, an antihalation dye, an irradiation preventing dye, a pigment (including a white pigment, such as titanium oxide), a dye for adjusting the color of the materials or coloring the materials, a heat polymerization inhibitor, a surface active agent, a dispersed vinyl compound, etc.

For exposing the aforesaid photosensitive material of this invention, various exposure means can be used. In general, any light source which is usually used for this purpose, such as sun light, electric flash, a tungsten lamp, a mercury lamp, a halogen lamp (such as an iodide lamp), a xenon lamp, laser light, a CRT light source, a plasma light source, a fluorescent lamp, a light emitting diode, etc., can be used. Also, an exposure means composed of a combination of a microshutter array utilizing LCD (liquid crystal) or PLZT (lanthanum-doped lead titanzirconate) and a linear light source or a plate-form light source, can be used in this invention.

In this invention, the photosensitive layer can be heated before light exposure and/or during light exposure and/or after light exposure.

In this invention, images are formed on the exposed element by washing out the unexposed portions, which are not insolubilized, with a solvent, by removing the unexposed unhardened portions by heat transfer, or other known methods as disclosed in U.S. Pat. Nos. 4,604,342, 4,587,199, 4,629,680, 4,431,723 and 4,550,073 and JP-A-61-285444, JP-A-61-213213 and JP-A-62-67529.

In the case of washing out the unexposed portions, an organic solvent or an aqueous alkaline solution such as described above can be used as the solvent for development.

As a suitable developer, there may be used an aqueous solution of an alkali carbonate, such as sodium carbonate; an aqueous solution of an alkali hydroxide, such as sodium hydroxide, or a mixture of the aforesaid solutions; an aqueous solution of a lower alcohol (e.g., ethanol and isopropanol) and an alkanolamine (e.g., ethanolamine, propanolamine, and 2-diethylaminoethanol), and the like.

When a surface active agent exists in the developer, the clear development of the photosensitive element of this invention can be promoted. The strength of the alkali in the developer depends upon the nature of the photopolymerizable composition being used. Also, the developer can further contain a dye or a pigment.

Images formed by the development are rinsed with distilled water, dried and, as the case may be, light-exposed again.

The following examples are given by way of illustration, but are not intended to limit the invention in any way.

EXAMPLE 1

Photopolymerizable compositions B-1 to B-3 shown below were prepared using photopolymerization initiator solutions A-1 to A-3 shown in Table 1 below.

Photopolymerizable Composition

| | |
|---|---|
| Pentaerythritol Tetraacrylate | 1.0 g |
| Benzyl Methacrylate/Methacrylic Acid Copolymer (73/27 by mole ratio) | 0.8 g |
| Acetone | 5 g |
| Methyl Ethyl Ketone | 10 g |
| Propylene Glycol Monomethyl Ether Acetate | 5 g |
| Photopolymerization initiator Solution (shown in Table 1) | |

TABLE 1

| | Photopolymerization Initiator Solution | | |
|---|---|---|---|
| Component | A-1 | A-2 | A-3 |
| Acetone | 5 g | 5 g | 5 g |
| Photopolymerization initiator (Compound No. 8) | 0.09 g | 0.09 g | 0.09 g |
| Additive (a)* | 0.06 g | — | 0.06 g |
| Additive (b)** | — | 0.06 g | 0.06 g |

*Additive (a) N,N-Dimethyl-2,6-diisopropylaniline
**Additive (b)

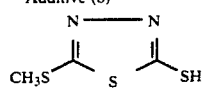

Each of the photopolymerizable compositions B-1 to B-3 thus obtained, was coated on a polyethylene terephthalate film of 100 μm in thickness at a thickness of 2 μm and dried for 2 minutes at 100° C. Then, the coating liquid for an overcoat layer having the composition shown below, was coated thereon at a thickness of 1 μm and dried for 2 minutes at 100° C. to provide photosensitive sheets 1 to 3.

Coating Liquid for Overcoat Layer

| | |
|---|---|
| Water | 98 g |
| Polyvinyl Alcohol | 1.7 g |
| Hydroxypropylmethyl Cellulose | 1.7 g |
| Polyvinylpyrrolidone | 8.7 g |

Each of the photosensitive sheets 1 to 3 thus prepared was exposed to a superhigh pressure mercury lamp of Jet Light (made by Oak K.K.) through a step wedge (Fuji Step Guide P, density step difference 0.15 density step No. 15 steps, made by Fuji Photo Film Co., Ltd.) using a vacuum printing frame apparatus, and then developed using the developer having the following composition.

Developer

| | |
|---|---|
| Anhydrous Sodium Carbonate | 10 g |
| Butyl Cellosolve | 5 g |
| Water | 1 liter |

After development, the portions of the photosensitive layer at the wedge steps giving less exposure were dissolved off to show the surface of the polyethylene terephthalate film and hence, the highest step number corresponding to the step wedge was determined as the step number of the sensitivity of the photosensitive sheet. The higher the step number, the higher the sensitivity. The results obtained are shown in Table 2 below.

TABLE 2

| Photo-sensitive Sheet | Initiation Solution | Step No. | Maximum Absorption Wavelength of Photo-sensitive Sheet |
|---|---|---|---|
| 1 | A-1 | Step 8 | 550 nm |
| 2 | A-2 | Step 12 | 550 nm |
| 3 | A-3 | Step 13 | 550 nm |

Sheet 1: Comparison sample
Sheets 2 and 3: Sheets according to the present invention As shown in Table 2 above, it can be seen that the photosensitive sheets 2 and 3 using the compound of formula (II) described above according to this invention show a remarkable sensitivity improving effect as compared to the photosensitive sheet 1.

EXAMPLE 2

Each of the photopolymerization initiator solutions C-1 to C-4 shown in Table 3 below was mixed with a solution of 8.4 g of Perscript Red I-6-B (trade name, made by Ciba-Geigy Corporation) as a color former dissolved in 35 g of trimethylolpropane triacrylate. The mixture was added to a mixed solution of 19 g of an aqueous solution of 18.6% of an isobutylene/maleic anhydride copolymer, 18 g of an aqueous 9.1% arabic, and 28 g of water, the pH of the mixed solution being adjusted to 7.0, and the pH of the resultant mixture was adjusted to 3.5. After heating the mixture of 60° C., 4.6 g of urea and 0.56 g of resorcin were emulsified therein.

Thereafter, 13 g of 30% formalin was added to the mixture followed by stirring for one hour. To the reaction mixture was added 9 g of an aqueous solution of 5% ammonium sulfate followed by further performing the reaction for one hour. Then the pH thereof was adjusted to 7.0 to provide microcapsule liquids D-1 to D-4 having mean grain size of 3.5 μm.

TABLE 3

| Component | Photopolymerization Initiator Solution | | | |
|---|---|---|---|---|
| | C-1 | C-2 | C-3 | C-4 |
| Methylene Chloride | 2 g | 2 g | 2 g | 2 g |
| Photopolymerization Initiator (Compound No. 8*) | 0.14 g | 0.14 g | — | — |
| Photopolymerization Initiator (Compound No. 9*) | — | — | 0.14 g | 0.14 g |
| Additive (a)** | 0.35 g | — | 0.35 g | — |
| Additive (b)*** | — | 0.35 g | — | — |
| Mercaptobenzoxazole | — | — | — | 0.35 g |

*Referred hereinbefore.
, *Same as in Table 1.

Preparation of Photosensitive Sheet and Image-Receiving Sheet

To 45 g of each of the microcapsule liquids D-1 to D-4 thus obtained, were added 1.53 g of an aqueous solution of 15% polyvinyl alcohol, 3.47 g of distilled water, and 0.57 g of starch to provide each coating liquid. Each coating liquid was coated on art paper using coating rod 10 and dried for 15 minutes at 50° C. to provide photo-sensitive sheets 4 to 7.

On the other hand, to 21.8 g of water were added 0.6 g of an aqueous solution of 48% SBR latex, 4 g of an aqueous solution of 10% etherified starch, 2.1 g of zinc carbonate, 1.3 g of an aqueous solution of 50% sodium silicate, 0.1 g of sodium hexametaphosphate, and 13 g of acid white clay and then the mixture was stirred for 15 minutes by a homogenizer.

The mixture was coated on art paper using coating rod 18 and dried for 2 minutes at 100° C. to provide an image-receiving Sheet.

Image Reproduction and Result

The reproduction of images was performed as follows.

Each of the photosensitive sheets described above was exposed through an original having line images to a superhigh pressure mercury lamp using Jet Light (made by Oak K.K.) through a step wedge of a density different of a relation of √2 (Fuji Step Guid P, made by Fuji Photo Film Co., Ltd.). After exposure, the photosensitive sheet thus exposed, was superposed on the image-receiving sheet with the coated surfaces in face-to-face relationship and the assembly was passed through press rollers at a line pressure of 100 kg/cm, whereby the microcapsules at the unexposed portions were ruptured and the content was transferred onto the image-receiving sheet to give clear black images of density 1.0. The density of the portions corresponding to the exposed portions was changed according to the exposure amount, and the lowest exposure step number having a density of not higher than 0.1 was employed as the sensitivity (corresponding to the foot sensitivity). That is, the larger the exposure step number, the higher the sensitivity. The results obtained are shown in Table 4.

TABLE 4

| Photosensitive Sheet | Photopolymerization Initiator Solution | Step No. |
|---|---|---|
| 4 | C-1 | Step 7 |
| 5 | C-2 | Step 15 |
| 6 | C-3 | Step 1 |
| 7 | C-4 | Step 9 |

Sheets 4 and 6: Comparison Samples
Sheets 5 and 7: Samples of according to the present invention.

From the results shown in Table 4 above, it can be seen that the photosensitive sheets 5 and 7 of the present invention show a higher sensitivity that those of the photo-sensitive sheets 4 and 6.

EXAMPLE 3

The procedure of Example 1 was repeated except that the following compounds were used, respectively, instead of additive (b):

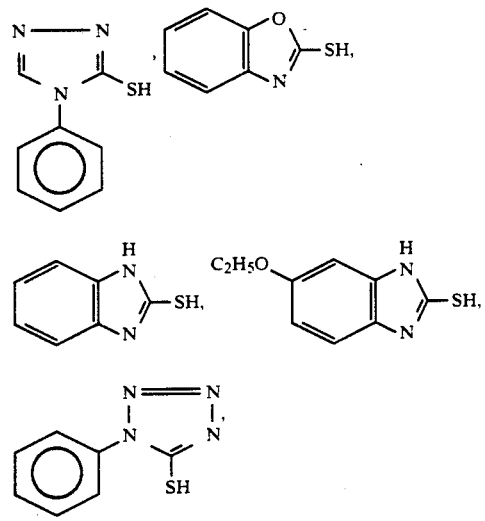

The photosensitive sheets prepared by the present photopolymerizable composition comprising the above compounds had high sensitivity as compared to the comparative photosensitive sheet prepared from the photopolymerizable composition B-1, and the sensitivity was as same as that of the photosensitive sheets 1 and 2 of the present invention.

While the invention has been described in detail and with reference to specific examples thereof, it will be apparent to one skilled in the art that various changes and modifications can be made therein without departing from the spirit and scope thereof.

What is claimed is:

1. A photopolymerizable composition consisting essentially of:
   (a) a polymerizable compound having at least one ethylenically unsaturated bond;
   (b) an organic boron compound anionic salt of an organic cationic dye represented by formula (I):

where D+ represents a cationic dye selected from the group consisting of cationic methine dyes, carbonium dyes, quinonimine dyes, guinoline dyes, and thiazole dyes, and $R^1$, $R^2$, $R^3$, and $R^4$, which may be the same or different, each represents an alkyl, aryl, aralkyl, alkaryl, alkenyl, alkinyl, alicyclic, heterocyclic, or allyl group having carbon atoms less than 18 or a group selected from the derivatives of these groups; with the proviso that at least two of said $R^1$, $R^2$, $R^3$, and $R^4$ may combine to form a ring structure; and (c) a compound having an -SH group in the molecule thereof, represented by formula (II):

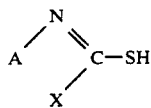 (II)

wherein X represents NR' wherein R' represents a hydrogen atom, an alkyl group having from 1 to 12 carbon atoms, a phenyl group or a phenyl group substituted with a halogen atom or an alkyl group having from 1 to 4 carbon atoms, an oxyten atom, a sulfur atom, a methylene group or a methine group; and A represents $—Y^1-Y^2—Y^3—$, $—Y^{1'}=Y^{2'}—Y^1$, $—Y^1—Y^{1'}=Y^{2'}—$, $—Y^1—Y^2—Y^{1'}=$, $—Y^{1'}=Y^{2'}—Y^3=$, $—Y^1—Y^2—$, $—Y^{1'}=Y^{2'}—$, $—Y^1—Y^{1'}=$, or

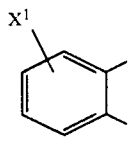

wherein $Y^1$, $Y^2$, and $Y^3$, which may be the same or different, each represents $>CX^2—X^3$ or $>N—X^4$ wherein $X^2$, $X^3$, and $X^4$, which may be the same or different, each represents a hydrogen atom or an alkyl group having from 1 to 12 carbon atoms, $Y^{1'}$, $Y^{2'}$ and $Y^{3'}$, which may be the same or different, each represents

or a nitrogen atom wherein $X^5$ represents a hydrogen atom, an alkyl group having from 1 to 12 carbon atoms, or $—SR''$ wherein R'' represents a hydrogen atom or an alkyl group having from 1 to 8 carbon atoms, and $X^1$ represents a hydrogen atom, an alkyl group having from 1 to 12 carbon atoms, a halogen atom, an alkoxy group having from 1 to 12 carbon atoms, a phenyl group, or a phenyl group substituted with a halogen atom or an alkyl group having from 1 to 4 carbon atoms.

2. A photopolymerizable composition as in claim 1, wherein the cationic dye is a cationic cyanine dye, carbocyanine dye, a hemicyanine dye, a rhodamine dye, or an azomethine dye.

3. A photopolymerizable composition as in claim 1, wherein said polymerizable compound is contained in microcapsules.

4. A photopolymerizable composition as in claim 3, wherein said polymerizable compound is contained in microcapsules.

5. A photopolymerizable composition as in claim 3, wherein said cationic cyanine dye is a cyanine dye represented by formula (III):

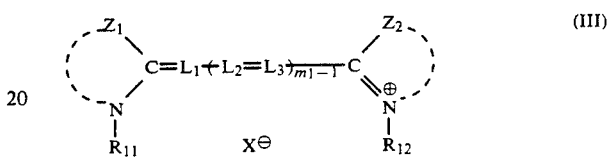 (III)

wherein $Z_1$ and $Z_2$ each represents an atomic group necessary for completing a heterocyclic nucleus ordinarily used for cyanine dyes; $L_1$, $L_2$, and $L_3$ each represents a melhine group or a substituted methine group; $R_{11}$ and $R_{12}$ each represents a lower alkyl group, a substituted alkyl group, an allyl group, or other substituted alkyl group which is usually used as an N-substituent of a cyanine dye; ml represents 1, 2, Or 3 and X- represents a boron compound anion, With the proviso that $L_1$ and $R_{11}$, $L_3$ and $R_{12}$, or, when $m_1$ is 3, $L_2$ and $L_2$ may be alkylenecrosslinked to form a 5 or 6-membered ring.

6. A photopolymerizable composition as in claim 1, wherein the compounds represented by formulae (I) and (II) are contained in an amount of from 0.01 to 50% by weight, based on the amount of said polymerizable compound.

7. A photopolymerizable composition as in claim 1, wherein said polymerizable compound is an ester of an unsaturated carboxylic acid or the salt thereof and an aliphatic polyhydric alcohol compound, or an amides of an unsaturated carboxylic acid or the salt thereof and an aliphatic polyhydric amine compound.

8. A photopolymerizable composition as in claim 7, wherein said unsaturated carboxylic acid is acrylic acid, methacrylic acid, itaconic acid, crotonic acid, isocrotonic acid, or maleic acid.

9. A photopolymerizable composition as in claim 1, further comprising a color image-forming material.

10. A photopolymerizable composition as in claim 9, wherein said color image-forming material is a thermochromic compound, a piezochromic compound, a photochromic compound, or a leuco compound.

11. A photopolymerizable composition as in claim 9, wherein said color image-forming material is a triarylmethane compound, a diphenylmethane compound, a xanthane compound, a thiazine compound, or a spiropyran compound.

* * * * *